(12) United States Patent
Sterling

(10) Patent No.: US 8,058,870 B2
(45) Date of Patent: Nov. 15, 2011

(54) METHODS AND SYSTEMS FOR MAGNETIC SENSING

(75) Inventor: James William Sterling, Livonia, MI (US)

(73) Assignee: Infineon Technologies AG, Neubiberg (DE)

( * ) Notice: Subject to any disclaimer, the term of this patent is extended or adjusted under 35 U.S.C. 154(b) by 779 days.

(21) Appl. No.: 12/130,571

(22) Filed: May 30, 2008

(65) Prior Publication Data
US 2009/0294882 A1 Dec. 3, 2009

(51) Int. Cl.
*G01R 33/02* (2006.01)

(52) U.S. Cl. ........................ 324/252; 324/251

(58) Field of Classification Search ........... 324/251–252
See application file for complete search history.

(56) References Cited

U.S. PATENT DOCUMENTS

| | | | |
|---|---|---|---|
| 4,188,605 A * | 2/1980 | Stout | 338/32 H |
| 4,496,303 A | 1/1985 | Loubier | |
| 4,785,242 A | 11/1988 | Vaidya et al. | |
| 5,210,489 A | 5/1993 | Petersen | |
| 5,260,653 A | 11/1993 | Smith et al. | |
| 5,781,005 A | 7/1998 | Vig et al. | |
| 5,801,529 A | 9/1998 | Umemoto et al. | |
| 5,888,416 A * | 3/1999 | Ikuma et al. | 252/62.54 |
| 5,936,400 A | 8/1999 | Tchertkov et al. | |
| 5,963,028 A | 10/1999 | Engel et al. | |
| 6,107,793 A | 8/2000 | Yokotani et al. | |
| 6,169,396 B1 | 1/2001 | Yokotani et al. | |
| 6,265,865 B1 | 7/2001 | Engel et al. | |
| 6,278,270 B1 | 8/2001 | Robles-Flores et al. | |
| 6,891,368 B2 | 5/2005 | Kawano et al. | |
| 6,949,386 B2 | 9/2005 | Piguet et al. | |
| 7,112,955 B2 | 9/2006 | Buchhold | |
| 7,250,760 B2 | 7/2007 | Ao | |
| 7,375,516 B2 | 5/2008 | Takenaga et al. | |
| 7,382,122 B2 | 6/2008 | Komatsu et al. | |
| 7,400,143 B2 | 7/2008 | Hayashi et al. | |
| 7,548,060 B2 | 6/2009 | Herrmann et al. | |
| 2003/0222642 A1 | 12/2003 | Butzmann | |
| 2004/0174164 A1 | 9/2004 | Ao | |
| 2005/0146052 A1 * | 7/2005 | Sakamoto et al. | 257/780 |
| 2005/0146323 A1 | 7/2005 | Kleinen et al. | |
| 2006/0164388 A1 | 7/2006 | Akieda et al. | |
| 2006/0261801 A1 | 11/2006 | Busch | |
| 2006/0279280 A1 | 12/2006 | Minamitani et al. | |
| 2007/0001664 A1 | 1/2007 | Steinbrink et al. | |
| 2007/0018642 A1 * | 1/2007 | Ao | 324/252 |
| 2007/0063693 A1 | 3/2007 | Modest | |

(Continued)

FOREIGN PATENT DOCUMENTS

DE 10123513 A1 3/2003
(Continued)

OTHER PUBLICATIONS

Abstract Translation of JP60223095A, Nov. 1985.*

(Continued)

*Primary Examiner* — Bot Ledynh

(74) *Attorney, Agent, or Firm* — Eschweiler & Associates, LLC

(57) ABSTRACT

One embodiment relates to a method of manufacturing a magnetic sensor. In the method, an engagement surface is provided. A magnet body is formed over the engagement surface by gradually building thickness of a magnetic material. The magnet body has a magnetic flux guiding surface that substantially corresponds to the engagement surface. Other apparatuses and methods are also set forth.

33 Claims, 11 Drawing Sheets

U.S. PATENT DOCUMENTS

| | | | |
|---|---|---|---|
| 2007/0075705 | A1 | 4/2007 | Kurumado |
| 2007/0145972 | A1 | 6/2007 | Auberger et al. |
| 2008/0116884 | A1* | 5/2008 | Rettig et al. ............. 324/207.21 |
| 2009/0243595 | A1* | 10/2009 | Theuss et al. ............ 324/207.11 |

FOREIGN PATENT DOCUMENTS

| | | | |
|---|---|---|---|
| DE | 10 2004 063 539 A1 | | 9/2005 |
| DE | 60207560 T2 | | 8/2006 |
| EP | 0 357 200 A2 | | 3/1990 |
| JP | 60223095 A | * | 11/1985 |
| JP | 63084176 A | | 4/1988 |
| JP | 11087797 A | | 3/1999 |
| JP | 2000292203 A | | 10/2000 |
| JP | 2000298134 A | | 10/2000 |
| JP | 2004294070 A | | 10/2004 |

OTHER PUBLICATIONS

R.S. Popovic, et al. "Integrated Hall-effect Magnetic Sensors." Department of Microengineering, EPFL, Swiss Federal Institute of Technology. CH-1015 Lausanne, Switzerland. 6 pages, (2001).

R.S. Popovic. "Not-plate-like Hall Magnetic Sensors and Their Applications." Swiss Federal Institute of Technology Lausanne, Room INR 137, CH-1015 Lausanne EPFL, Switzerland. 10 Pages, (2000).

Paul Leroy, et al. Optimization of the Shape of Magnetic Field Concentrators to Improve the Sensitivity of Hall Sensors. Technisches Messen 73 (2006). 12 Pages.

Hung, et al., "Effects of Additives on the Orientation and Strength of Plastic Ferrite Magnet", IEEE Transaction Magn., vol. 25, No. 5, Sep. 1989, p. 3287-3289.

Office Action dated Sep. 14, 2010 in connection with U.S. Appl. No. 11/950,050.

Office Action dated Apr. 20, 2010 in connection with U.S. Appl. No. 11/950,050.

U.S. Appl. No. 11/950,050, filed with USPTO on Dec. 4, 2007.

U.S. Appl. No. 12/129,962, filed with USPTO on May 30, 2008.

Office Action dated Aug. 17, 2009 in connection with U.S. Appl. No. 12/129,962.

Office Action dated Jan. 20, 2010 in connection with U.S. Appl. No. 12/129,962.

Office Action dated Oct. 29, 2010 in connection with U.S. Appl. No. 12/129,962.

Office Action dated Jan. 13, 2011 in connection with U.S. Appl. No. 12/129,962.

Non-Final Office Action Dated Apr. 25, 2011 for U.S. Appl. No. 12/129,962. 23 Pages.

Non-Final Office Action Dated Jun. 22, 2011 for U.S. Appl. No. 11/950,050. 38 Pages.

English machine translaton of the detailed description of JP 11-087797 A. Obtained on Jul. 11, 2011 from the JPO website.

Wikipedia, Permanent Magnets Information, 2011.

Hyperphysics, Permanent Magnets Information, 2011.

Office Action dated Sep. 21, 2011 issued to U.S. Appl. No. 12/129,962.

* cited by examiner

METHODS AND SYSTEMS FOR MAGNETIC SENSING

FIELD OF INVENTION

The present invention relates to methods and systems for magnetic field sensing.

BACKGROUND

In many applications, it is useful to detect changes in magnetic field to track translational motion, rotational motion, proximity, speed and the like. Accordingly, magnetic field sensors are used in a wide variety of applications to detect subtle (or drastic) changes in magnetic field.

Magnetic field sensors are often used in large scale industrial applications, such as in automobiles. For example, magnetic field sensors are often used to detect the angle of a crankshaft or camshaft, and can also be used to measure tire speed rotation and a host of other conditions. Magnetic field sensors are also used in small-scale devices, such as computers. For example, magneto resistive sensors are currently the leading technology used for read heads in computer hard disks. Due to the wide range of applications, improvements in magnetic field sensors are a valuable contribution to the marketplace.

SUMMARY

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

One embodiment relates to a method of manufacturing a magnetic sensor. In the method, an engagement surface is provided. A magnet body is formed over the engagement surface by gradually building thickness of a magnetic material. The magnet body has a magnetic flux guiding surface that substantially corresponds to the engagement surface.

The following description and annexed drawings set forth in detail certain illustrative aspects and implementations of the invention. These are indicative of but a few of the various ways in which the principles of the invention may be employed.

DRAWINGS

DETAILED DESCRIPTION

Figure 1:
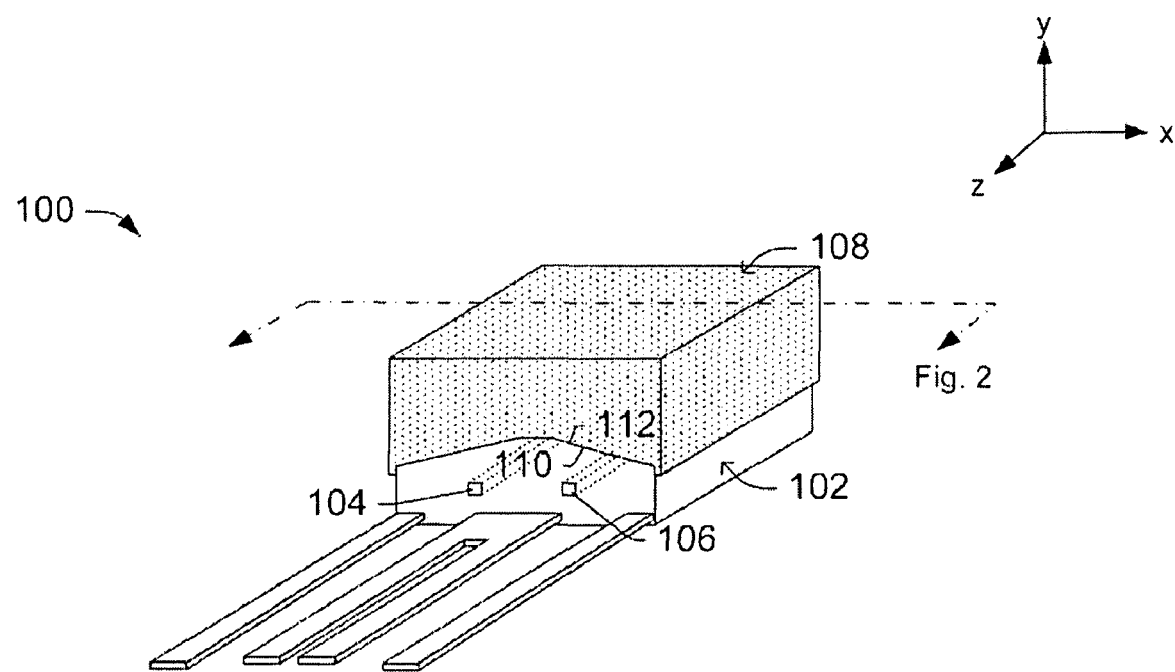
FIG. 1 shows a three-dimensional depiction of a Giant Magneto Resistive (GMR) sensor in accordance with one embodiment.

The present invention will now be described with reference to the drawings wherein like reference numerals are used to refer to like elements throughout, and wherein the illustrated structures are not necessarily drawn to scale. Nothing in this detailed description (or drawings included herewith) is admitted as prior art. Several embodiments that relate to magnetic sensors are described herein. The sensors also include a magnet body that is adapted to guide magnetic field lines in a predetermined manner with respect to at least one sensing element. In some embodiments, these and other magnetic sensors are formed by manufacturing methods that provide improved tolerances and higher yields than previously achievable.

Figure 2:
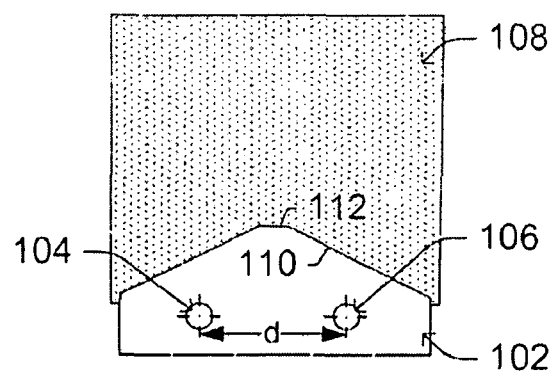
FIG. 2 depicts a cross-sectional view of FIG. 1's Giant Magneto Resistive sensor with magnetic field lines superimposed thereon.

FIGS. 1-2 show an embodiment of a magnetic sensor. In this illustrated embodiment, a magneto resistive sensor 100 includes an integrated circuit package 102 that includes a pair of sensing elements 104, 106. The sensing elements 104, 106 are laterally separated from one another by a distance, d. In some embodiments, these sensing elements 104, 106 could be anisotropic magneto resistive (AMR) or giant magneto resistive (GMR) sensing elements.

To back bias the sensing elements, a magnet body 108 is formed over an engagement surface 110 of the integrated circuit package 102. The magnet body 108 has a magnetic flux guiding surface 112 that substantially corresponds to the engagement surface 110. This substantial correspondence allows for accurate alignment of the magnet body 108 relative to the sensing elements 104, 106. Although the illustrated embodiment shows the magnetic flux guiding surface 112 formed directly on the engagement surface 110, in other embodiments one or more intermediate layers could also be formed between these surfaces 110, 112.

Due to the geometry of the magnet body 108, magnetic field lines 114 are perpendicularly guided through the sensing elements 104, 106. This is achieved by fashioning the magnetic flux guiding surface 112 to be substantially v-shaped. Although the illustrated magnetic flux guiding surface 112 comprises three planar surfaces on top of the integrated circuit 102, note that "substantially v-shaped" may also include v-shaped surfaces with any number of planar surfaces, U-shaped surfaces, curved surfaces, and irregularly shaped surfaces, among others.

Because the sensing elements 104, 106 are sensitive only to x-component changes in the magnetic field, the geometry of the magnet body 108 facilitates the sensing elements 104, 106 switching between a magnetically saturated state (high or low resistance) and a magnetically unsaturated state (neutral resistance) depending on the proximity of an object to be detected and the amplitude of the biasing magnetic field.

Although FIGS. 1-2 show the magneto resistive sensor 100 with a pair of sensing elements 104, 106; in other illustrated embodiments the magneto resistive sensor 100 could include other numbers of sensing elements. For example, in one embodiment, only a single magneto resistive sensing element is included, thereby allowing the magneto resistive sensor 100 to act as a switch. In another embodiment, the magneto resistive sensor 100 could include three or more magneto resistive sensing elements, thereby allowing the magneto resistive sensor 100 to detect translational motion of an object passing by. For example, by using an algorithm, the magneto resistive sensor 100 could correlate information from the three magneto resistive sensing elements to determine whether the object was moving left-to-right or right-to-left relative to the magneto resistive sensor 100.

Figure 3:
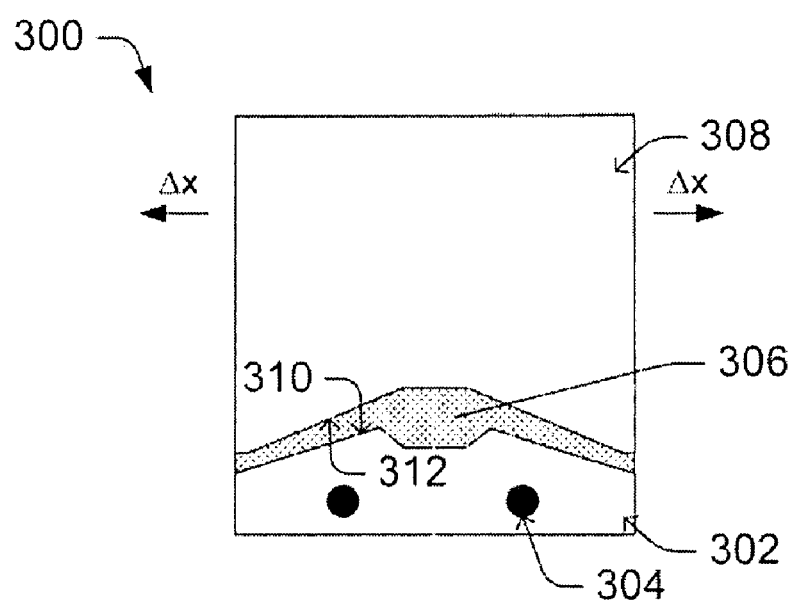
FIG. 3 shows a cross-sectional view of a magnetic sensor produced by attaching a pre-formed magnet to an integrated circuit package.

Referring now to FIG. 3, one embodiment another magnetic sensor 300 and a method of manufacturing this magnetic sensor is discussed. In the magnetic sensor 300, a layer of epoxy 306 adheres the integrated circuit package 302 to a pre-formed magnet 308. During assembly of the magnetic sensor 300, the integrated circuit package 302 is first manufactured around the at least one sensing element 304. Next, the epoxy layer 306 is deposited. Finally, the pre-formed magnet 308, which is machined to have a desired geometry, is placed onto the epoxy layer 306. This method of manufacture is one straightforward way of assembling a magnetic sensor 300, and could be used in accordance with some aspects of the present disclosure.

To limit tolerance (or uncertainty $\Delta x$) due to mechanical precision or other causes, the magnetic sensor 300 includes an engagement surface 310 that substantially corresponds to a magnetic flux guidance surface 312. Therefore, these substantially corresponding surfaces 310, 312 help align the magnetic flux guidance surface 312 relative to the sensing elements 304, thereby facilitating perpendicular or other predetermined guidance of magnetic field lines.

Figure 4:
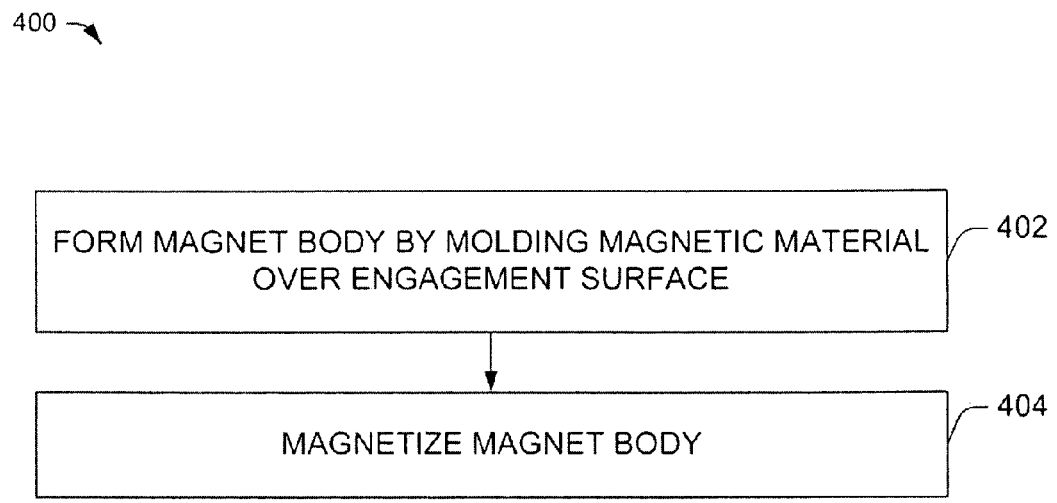
FIG. 4 is a flowchart showing one embodiment of a method for manufacturing a magnetic sensor.
Figure 5:
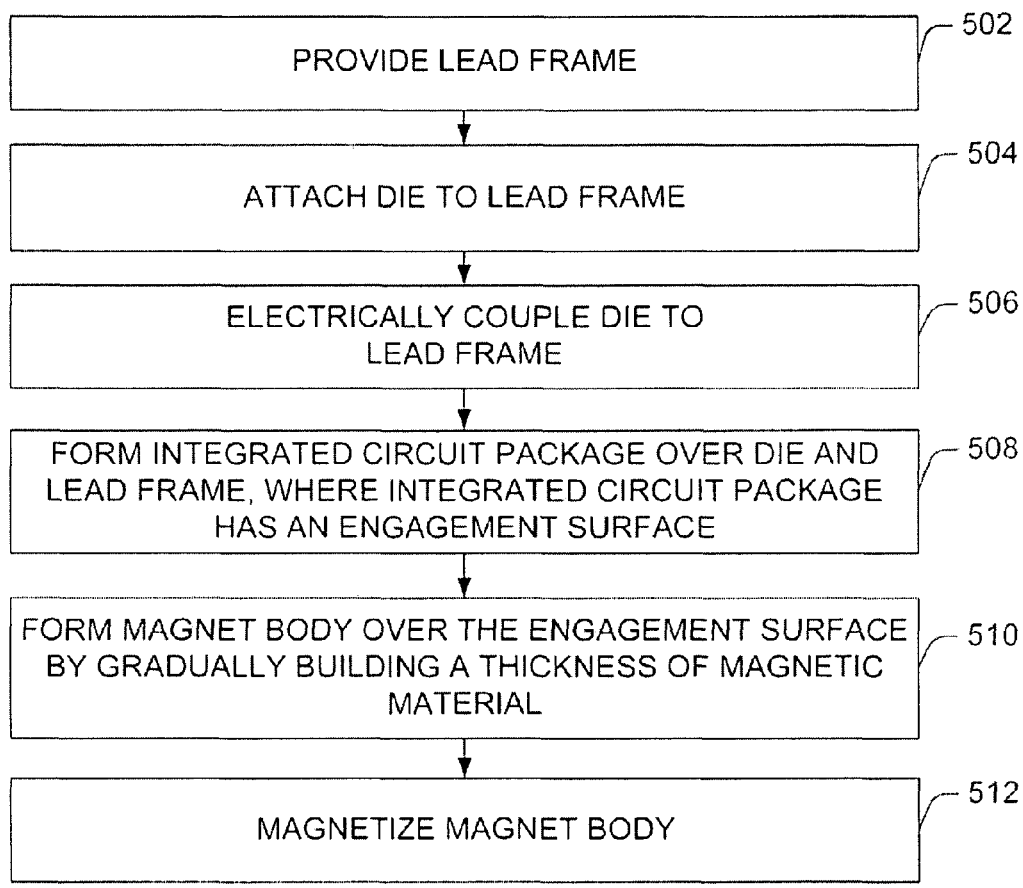
FIG. 5 is a flowchart showing more detailed embodiment of a method for manufacturing a magnetic sensor.

As the inventors have further appreciated, in attempting to machine a pre-formed magnet 308 to a complex geometry, the manufacturer may end up fracturing the magnet, thereby resulting in reduced yields and wasted expenditures. To limit these and other shortcomings, the inventors have devised improved methods of manufacturing magnetic sensors. More specifically, the inventors have devised manufacturing methods where a magnet body is formed by gradually building up a magnetic material over an engagement surface. Thus, FIG. 4 illustrates a somewhat general method of forming a magnetic sensor 400, while FIGS. 5-9, and FIGS. 10-16 show more detailed methods 500, 1000. Although these methods 400, 500, 1000 are illustrated and described herein as a series of signal acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Turning now to FIG. 4, method 400 starts at 402 when a magnet body is formed by molding magnetic material over an engagement surface. In some embodiments, this engagement surface could be an exterior surface on an integrated circuit package (see e.g., FIGS. 5-9) or could be an exterior surface of a lead frame (see e.g., FIGS. 10-16). Next at 404, the magnet body is magnetized. In some embodiments, this magnetization can occur concurrently with the molding of the magnetic material, but in other embodiments can occur after the magnet body has been formed. For example, the magnetization can occur just prior to testing of the sensor. During magnetization, the magnetic field of the magnet body may be aligned to a sensitive axis of the magnetic sensor, so that proper back-biasing occurs when the magnetic sensor is used. After the magnetic sensor is processed according to the method 400, the magnetic sensor can be tested and packed for shipment to customers.

Referring now to FIGS. 5-9, one can see a more detailed embodiment for forming a magneto resistive sensor. As can be seen, FIGS. 6-9 show one implementation of how FIG. 5's method can be implemented.

Figure 6:
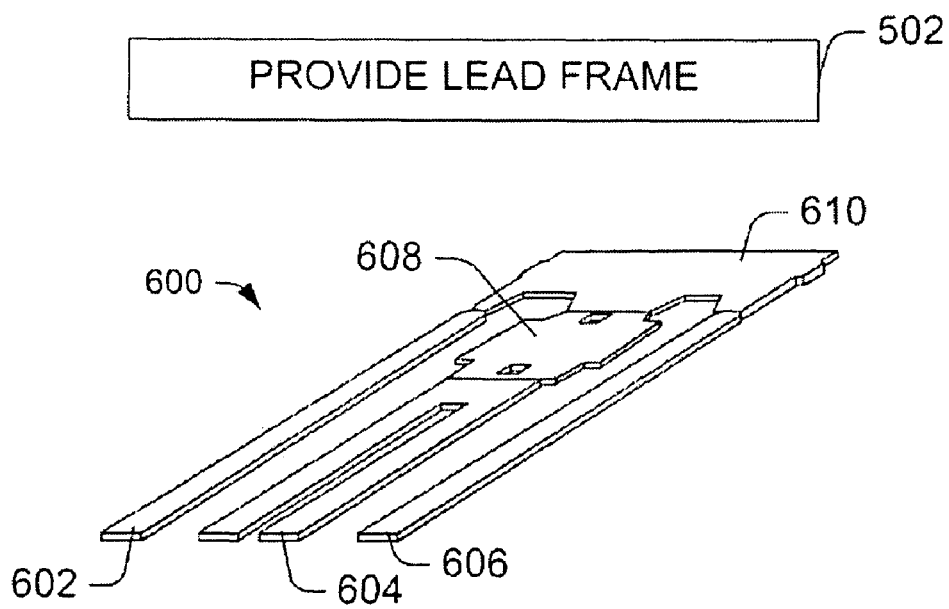
FIGS. 6-9 show three dimensional depictions of a magnetic sensor at various stages of manufacture consistent with FIG. 5's flowchart.

In FIG. 6 (502), a lead frame 600 is provided. In this example, the leadframe includes a first terminal 602, a second terminal 604, and a third terminal 606, as well as a substantially planar die area 608. In other embodiments the lead frame 600 could include any number of terminals, depending on the functionality desired for the circuit. A removable tie bar 610, which ties adjacent lead frames together during sensor manufacturing, will be removed after processing so that individual magnetic sensors can be tested and packaged.

Figure 7:
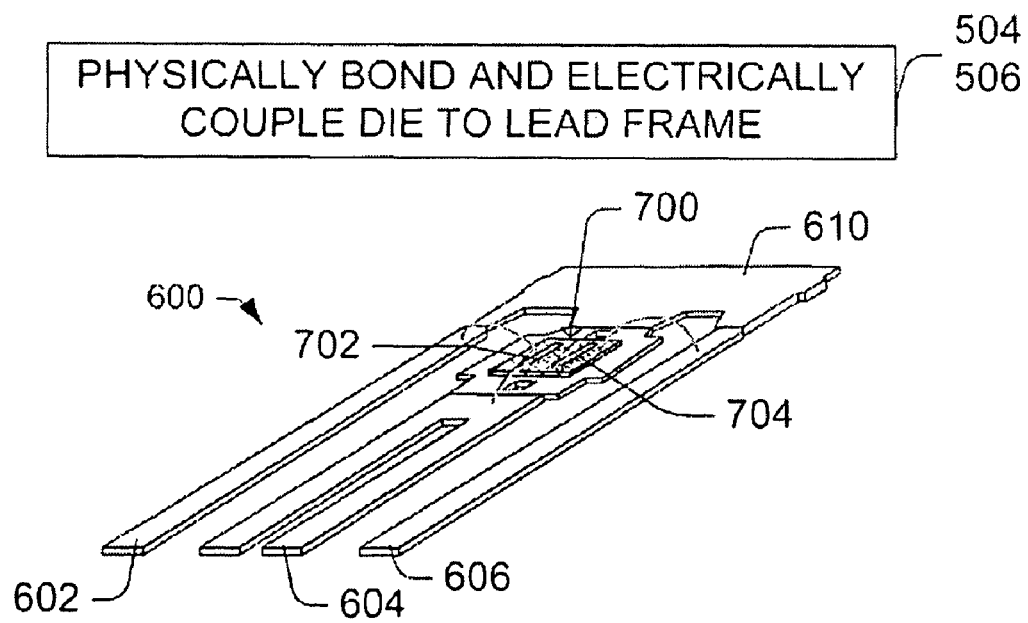

In FIG. 7 (504, 506), a die 700 has been attached to the die area 608 on the lead frame 600. The die 700 includes at least one magnetic sensing element (e.g., a magneto resistive sensing element or a Hall sensing element). In the illustrated example, the die 700 includes first and second sensing elements 702, 704, respectively, however in other embodiments the die 700 could include other numbers of sensing elements. Bonding pads on the die have also been respectively wire bonded to the terminals on the leadframe.

Figure 8:
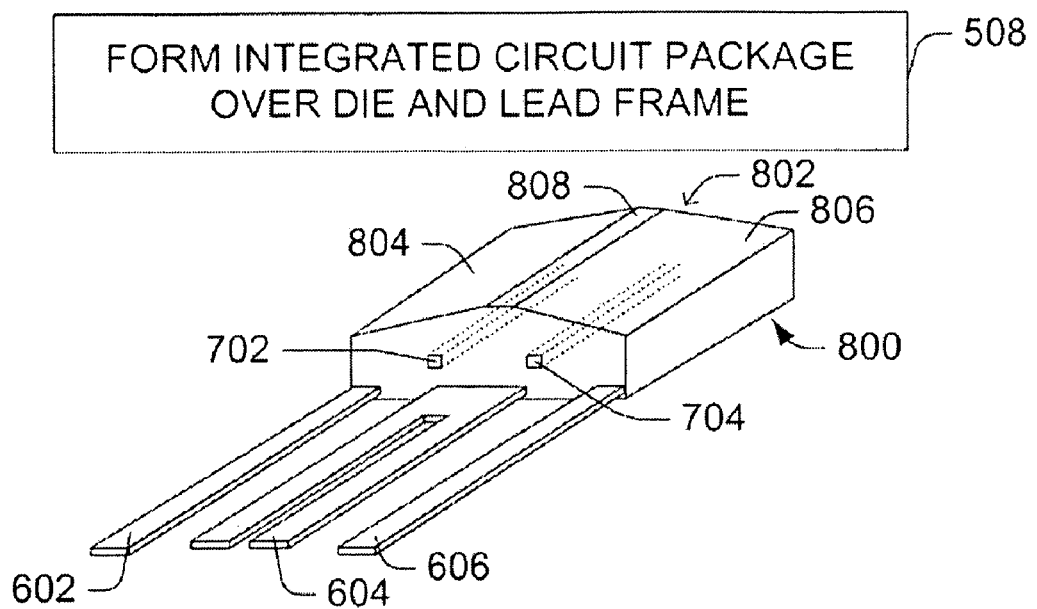

In FIG. 8 (508), an integrated circuit package 800 is formed over the die. The package is formed with an engagement surface 802. Thus, in the illustrated embodiment, the engagement surface 802 is a substantially v-shaped surface that includes first and second ramped surfaces 804, 806 that meet at a third surface 808. The preferred angle of the v-shape is a product of the sensing element position within the package and the general physical dimensions of the magnet, which provides great incentive for incorporating the desired shape within the package itself. In many embodiments, the first and second ramped surfaces 804, 806, meet at an angle within approximately 135 and 170°.

Figure 9:
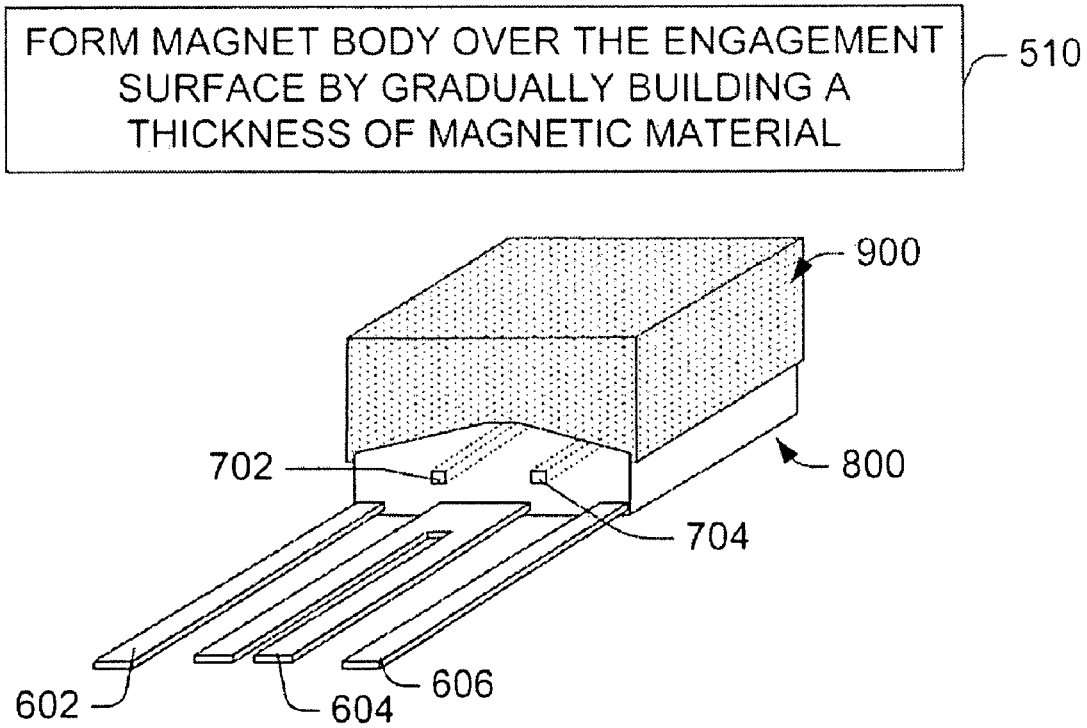
Figure 10:
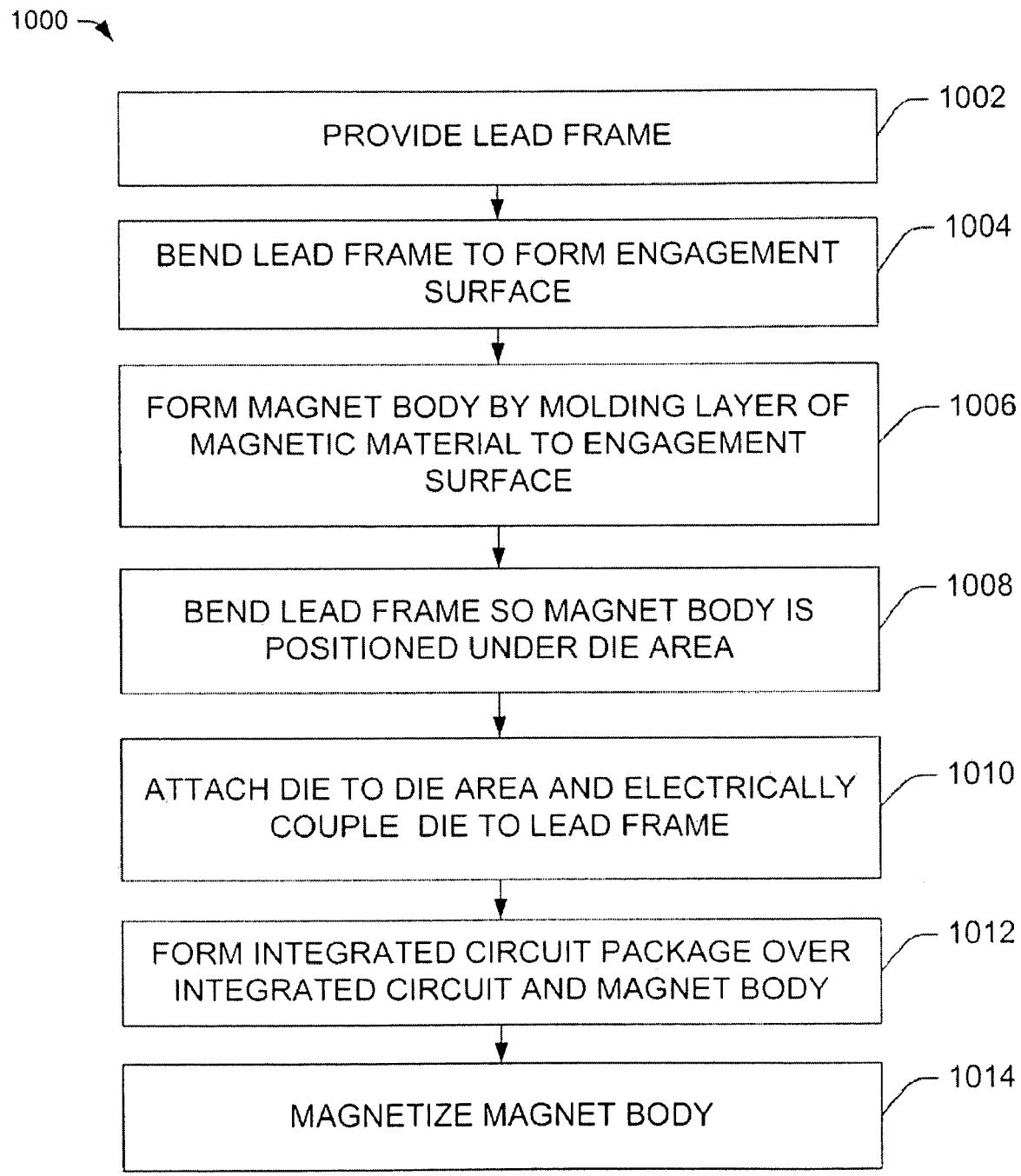
FIG. 10 is a flowchart showing more detailed embodiment of a method for manufacturing a magnetic sensor.

In FIG. 9 (510), a magnet body 900 is formed by molding magnetic material over the engagement surface 802 of the integrated circuit package 800. Thus, the magnet body is formed by gradually building thickness of the magnetic material, where gradual indicates that the thickness is built up over some (often short) time period. Because the magnet body 900 is molded, the method 500 does not require machining magnets into complex shapes prior to assembly of the sensor. Thus, molding a magnetic material to the engagement surface 802 eases manufacture compared to other manufacturing methods where magnets are machined and then adhered (glued) to the integrated circuit package. In one embodiment, the magnet body 900 could be formed by injection molding, but other molding processes could also be used. In one embodiment, the magnetic material could include a nylon binder mix impregnated with samarium cobalt (SmCo). The molded magnets however can use any magnetic material or rare Earth element, neodymium (NdFeB) and ferrite are additional examples, and the binder material holding the magnet together can be a variety of thermoplastics like PBT or Nylon 6, 6/6, and 6/12. A thermoset material, like epoxy, could also be used as a binder and moulded to form the magnet package.

Referring now to FIGS. 10-16, one can see another embodiment where the magnetic material is molded onto the lead frame, rather than molded onto an integrated circuit.

Figure 11:
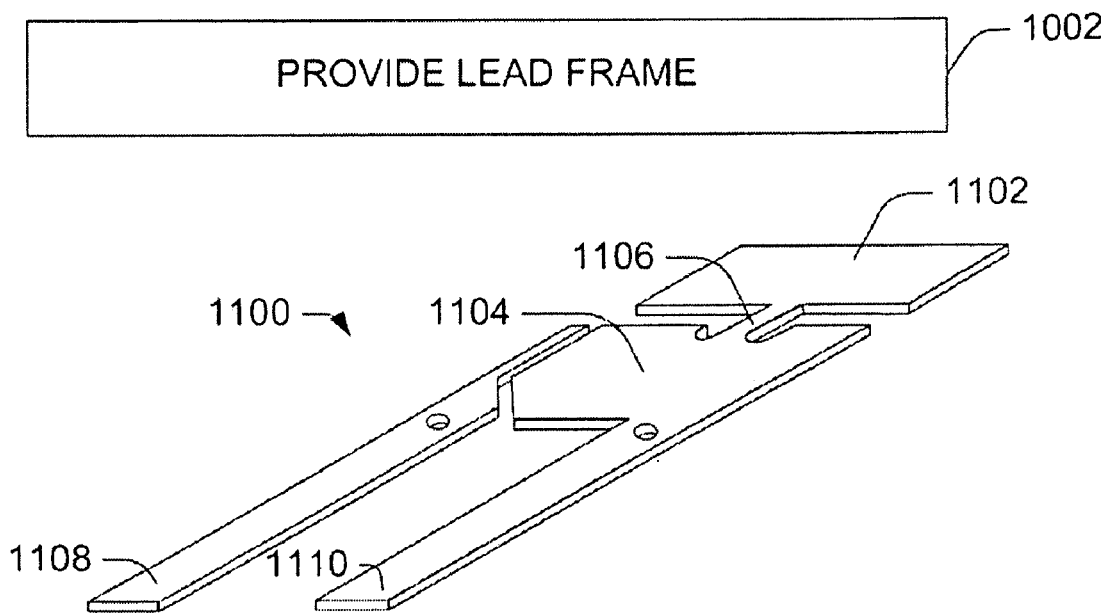
FIGS. 11-16 show three dimensional depictions of a magnetic sensor at various stages of manufacture consistent with FIG. 10's flowchart.

In FIG. 11 (1002), a lead frame 1100 is again provided. In this embodiment, the lead frame 1100 comprises an engagement surface 1102 and a die area 1104, which are separated from one another by a bendable member 1106. Although the illustrated lead frame 1100 includes first and second terminals 1108, 1110, other lead frames could include other numbers of terminals.

Figure 12:
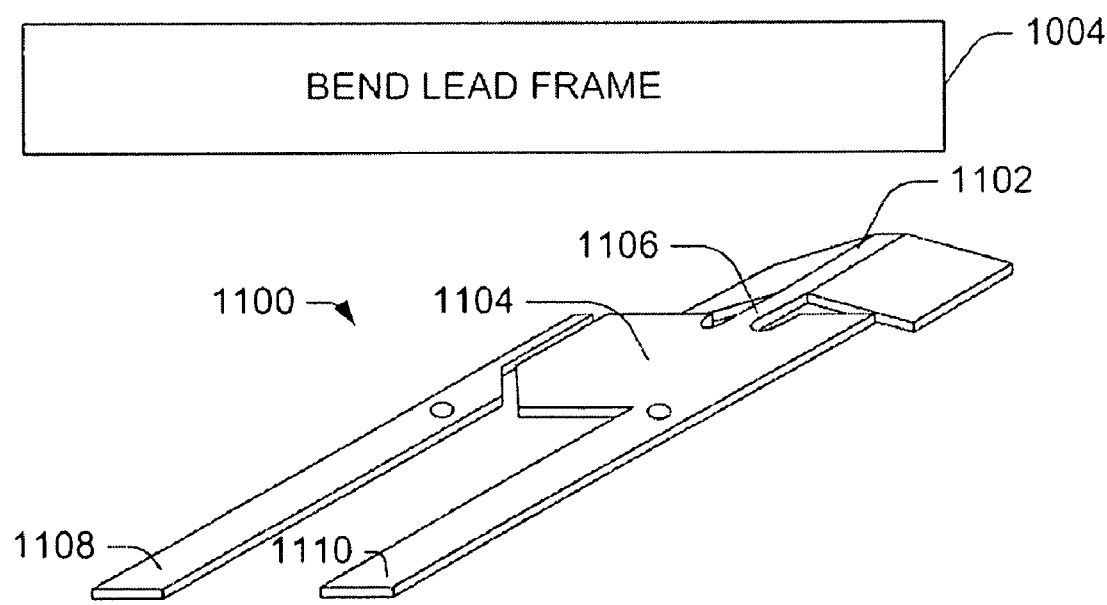

In FIG. 12 (1004), the engagement surface 1102 is bent to correspond to a magnetic flux guiding surface desired for a magnet body. Thus, in the illustrated embodiment, the engagement surface 1102 of the lead frame is bent into a substantially v-shaped configuration.

Figure 13:
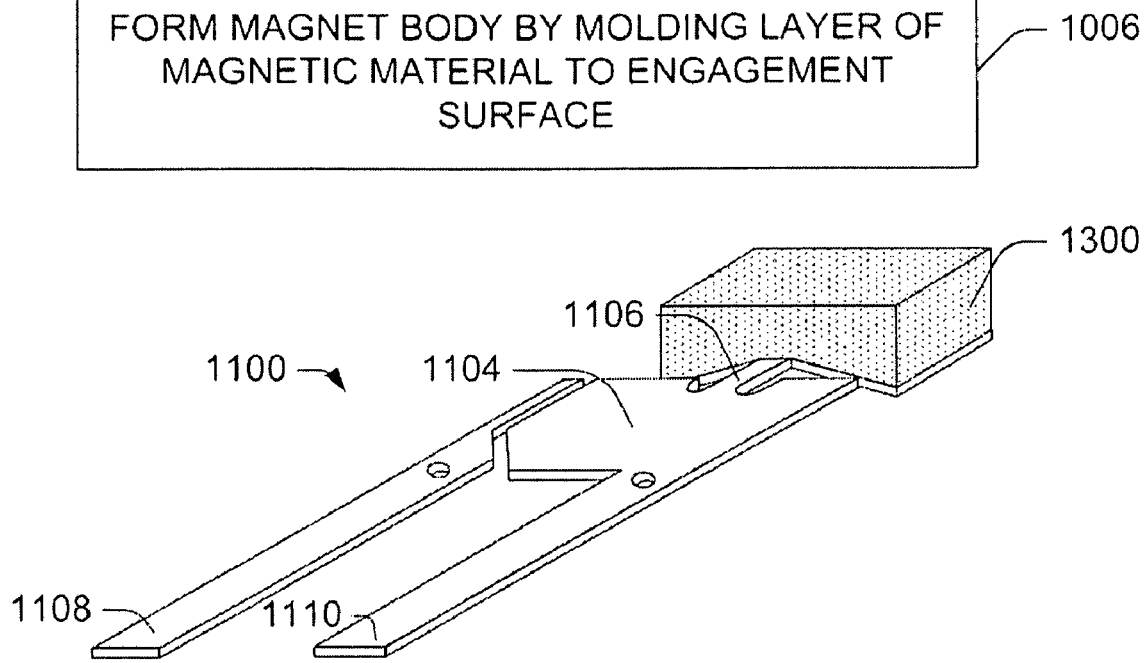

In FIG. 13 (1006), a magnet body 1300 is formed by gradually building a thickness of magnetic material to the engagement surface 1102. In one embodiment, this could be achieved by injection molding, but could also be accomplished by other processes.

Figure 14:
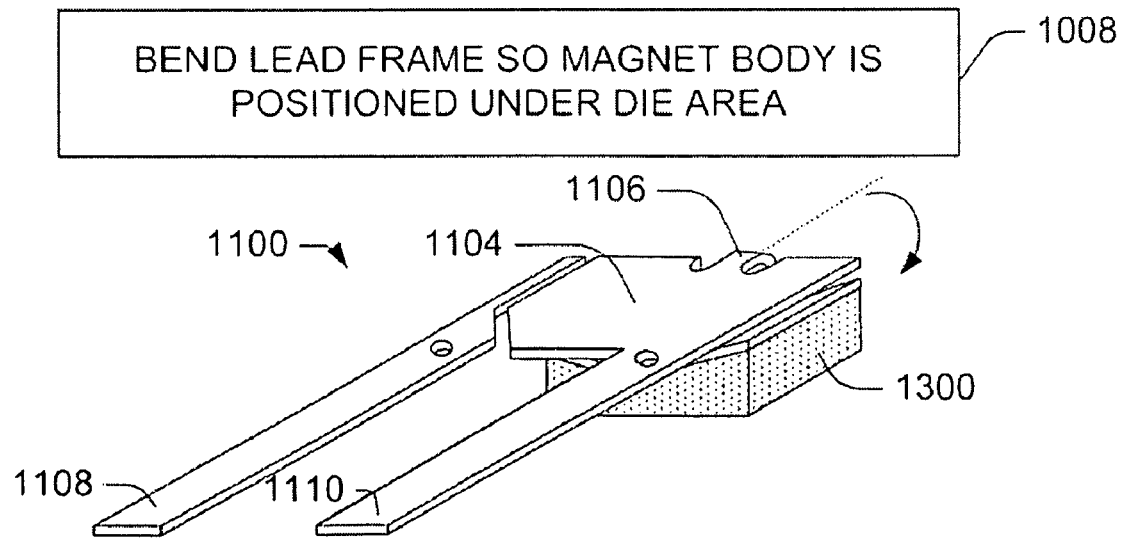

In FIG. 14 (1008), the bendable member 1106 is bent to position the magnet body 1300 underneath the die area 1104. Although the illustrated embodiment shows the magnet body 1300 being bent underneath the die area 1104, in other embodiments the geometry of the magnet body could be inverted, and the magnet body 1300 could be bent over the die area.

Figure 15:
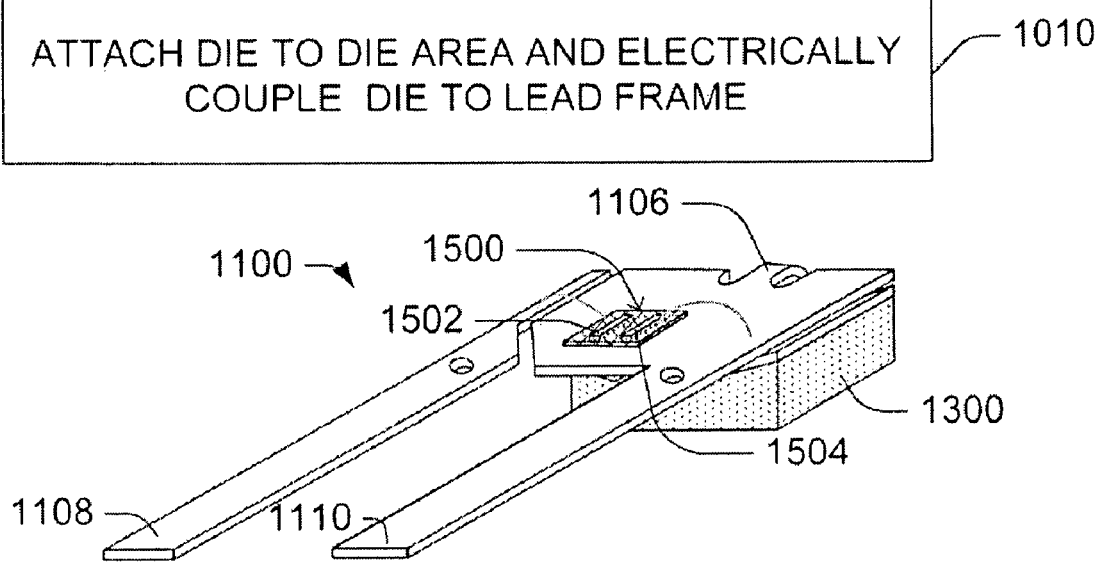

In FIG. 15 (1010), a die 1500 is attached to the die area 1104 and is electrically coupled to the lead frame 1110, for example by wire bonding. In other embodiments, the die 1500 could be attached to the underside of the die area.

Figure 16:
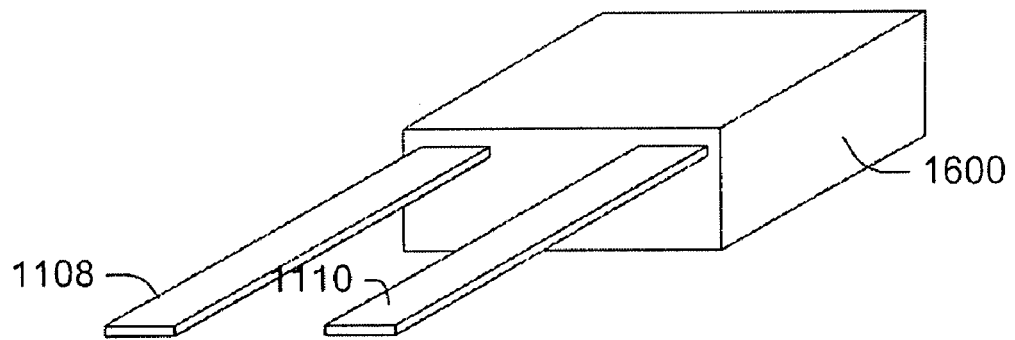

In FIG. 16, an integrated circuit package 1600 is formed over the die and magnet body. In some embodiments, the integrated circuit package could comprise plastic or ceramic, but could also comprise other materials in other embodiments.

Figure 17:
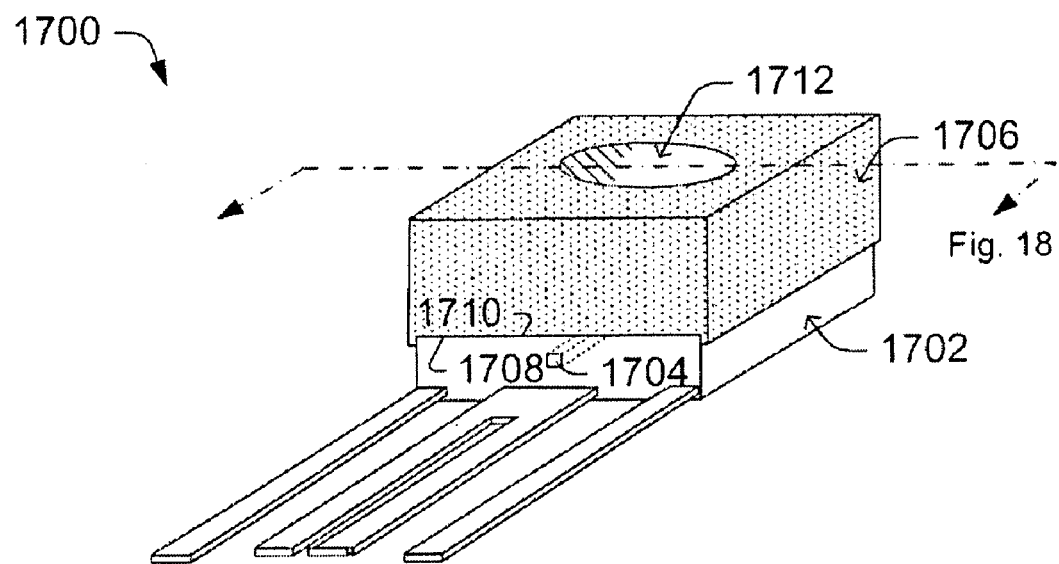
FIG. 17 depicts a three-dimensional depiction of a Hall sensor in accordance with one embodiment.
Figure 18:
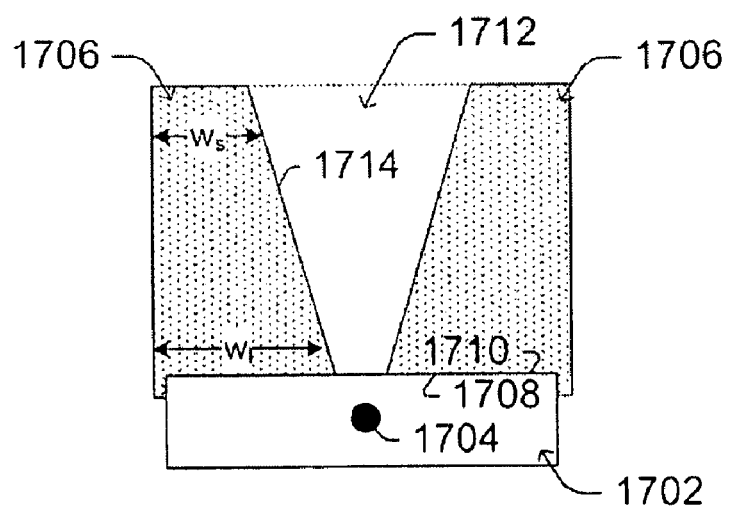
FIG. 18 depicts a cross-sectional view of FIG. 17's Hall sensor.

Although various embodiments for manufacturing a magnetic sensor have been discussed and illustrated above in the context of magneto resistive sensors, the manufacturing methods and other concepts are also applicable to other types of magnetic sensors. FIG. 17-18 show another example of a magnetic sensor implemented as a Hall sensor 1700. In this embodiment, the Hall sensor 1700 includes an integrated circuit package 1702 that includes a single Hall sensing element 1704. To back-bias the Hall sensing element 1704, a magnet body 1706 is formed over an engagement surface 1708 of the integrated circuit package 1702. Again, the magnet body 1706 has a magnetic flux guiding surface 1710 that substantially corresponds to the engagement surface 1708 of the integrated circuit package 1702. Although not shown, intermediate layers could also be formed between these engagement surfaces 1708, 1710.

The magnet body 1706 can be characterized by a conical recess 1712 that is positioned over the Hall sensing element 1704. Thus, the magnet body 1706 includes tapered sidewalls 1714. These tapered sidewalls 1714 establish a larger width $w_L$ near the engagement surface 1710 and smaller width, $w_S$, associated with a face opposite the engagement surface 1710. In the absence of an object to be detected, this geometry is designed to establish an approximately zero magnetic field condition in the Hall sensing element 1704. Consequently, when an object to be detected comes in close proximity to the Hall sensor 1700, the magnetic field extends through the area previously void of field and acts on or saturates the Hall sensing element 1704.

As will be understood by a person of ordinary skill in the art, this Hall sensor 1700 could also be manufactured by forming magnetic material on an engagement surface of an integrated circuit package or lead frame. In some embodiments, this manufacturing could be analogous to the previously discussed manufacturing methods.

Further, although some examples of integrated circuit packages are illustrated and discussed above, these examples are not limiting. The concept of forming a magnetic material on an integrated circuit package can also be applied to other types of integrated circuit package, including but not limited to: Ball Grid Arrays, Quad Flat Packs, Pin Grid Arrays, Ceramic Quad Flat Packs, Single Lead-Less Chip Carriers, Dual Lead-Less Chip Carriers, J-Leaded Chip Carriers, and Low-Profile, among others.

In regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for forming a magnetic sensor, comprising
    providing an engagement surface;
    depositing an epoxy layer on the engagement surface, a surface of the epoxy layer formed having three planar surfaces; and
    forming a magnet body over the engagement surface and on the epoxy layer by gradually building thickness of a magnetic material, the magnet body having a magnetic flux guidance surface having three planar surfaces and being substantially v-shaped to facilitate perpendicular guidance of magnetic field lines.

2. The method of claim 1, where gradually building thickness of the magnetic material comprises injection molding the magnetic material over the engagement surface.

3. The method of claim 2, where the magnetic material comprises a rare earth element.

4. The method of claim 2, where the magnetic material comprises ferrite.

5. The method of claim 1, where the engagement surface comprises an external surface of a lead frame or an external surface of an integrated circuit package.

6. The method of claim 5, further comprising:
    providing at least one sensing element on the lead frame or in the integrated circuit package.

7. The method of claim 6, where the magnet body is formed to perpendicularly guide magnetic field lines through the at least one sensing element.

8. The method of claim 6, where the magnet body is formed to establish an approximately zero magnetic field condition in the at least one sensing element.

9. The method of claim 6, where the magnet body comprises a substantially conical surface that defines a recess in the magnet body, where the recess is positioned above the at least one sensing element.

10. A method for forming a magnetic sensor, comprising:
    providing an integrated circuit that comprises at least one sensing element;
    forming an integrated circuit package over the integrated circuit, where the integrated circuit package comprises an engagement surface that facilitates alignment of a magnet body relative to the at least one sensing element; and forming a magnetic flux guidance surface having three planar surfaces and being substantially v-shaped over the engagement surface.

11. The method of claim 10, where forming the magnetic flux guidance surface comprises:

forming the magnet body over the engagement surface by gradually building a thickness of a magnetic material over the engagement surface.

12. The method of claim 1, where the magnetic flux guiding surface substantially corresponds to the engagement surface.

13. The method of claim 10, where the integrated circuit comprises at least one magneto resistive sensing element.

14. The method of claim 10, where the integrated circuit comprises at least one Hall sensing element.

15. A method for manufacturing a magnetic sensor, comprising:

providing a lead frame that comprises: a die area and an engagement surface separated from one another by a bendable member;
providing a magnet body over the engagement surface;
bending the bendable member so the magnet body is positioned over or under the die area.

16. The method of claim 15, further comprising:
attaching an integrated circuit to the die area, where the integrated circuit includes at least one magnetic sensing element.

17. The method of claim 16, further comprising:
forming an integrated circuit package over the integrated circuit and magnet body.

18. A magnetic sensor, comprising
an integrated circuit comprising at least one sensing element;
an integrated circuit package overlying the integrated circuit, wherein the integrated circuit package comprises an engagement surface that facilitates alignment of a magnet body relative to the at least one sensing element; and
a magnetic flux guidance surface having three planar surfaces and being substantially v-shaped on the engagement surface.

19. The magnetic sensor of claim 18, wherein the magnetic flux guidance surface comprises:
a magnet body overlying the engagement surface, where the magnet body has the magnetic flux guiding surface that substantially corresponds to the engagement surface.

20. The magnetic sensor of claim 19, where a geometry of the magnet body is adapted to guide magnetic field lines in a predetermined manner with respect to the at least one sensing element.

21. The magnetic sensor of claim 19, where the magnet body is formed to perpendicularly guide magnetic field lines through the at least one sensing element.

22. The magnetic sensor of claim 19, where the magnet body is formed to establish an approximately zero magnetic field condition in the at least one sensing element.

23. The magnetic sensor of claim 19, where the magnet body comprises a substantially conical surface that defines a recess in the magnet body, where the recess is positioned above the at least one sensing element.

24. A magnetic sensor, comprising
an integrated circuit comprising at least one sensing element;
an integrated circuit package overlying the integrated circuit, wherein the integrated circuit package comprises an engagement surface;
an epoxy layer formed over the engagement surface of the integrated circuit package; and
a magnet body overlying the engagement surface and the epoxy layer, where the magnet body has a magnetic flux guiding surface that substantially corresponds to the engagement surface, the magnetic flux guiding surface having three planar surfaces and being substantially v-shaped.

25. The magnetic sensor of claim 24, where a geometry of the magnet body is adapted to guide magnetic field lines in a predetermined manner with respect to the at least one sensing element.

26. The magnetic sensor of claim 24, further comprising:
at least one intermediary layer between the engagement surface and the magnetic flux guiding surface.

27. The magnetic sensor of claim 24, where the engagement surface directly abuts the magnetic flux guiding surface.

28. The magnetic sensor of claim 24, where the geometry of the magnet body is adapted to perpendicularly guide magnetic field lines through the at least one sensing element.

29. The magnetic sensor of claim 24, where the geometry of the magnet body is adapted to establish an approximately zero magnetic field condition in the at least one sensing element.

30. The magnetic sensor of claim 24, where the magnet body comprises a conical surface that defines a recess in the magnet body above the at least one sensing element.

31. A magnetic sensor, comprising
an integrated circuit comprising at least one sensing element;
a magnet body comprising a magnetic flux guiding surface that is adapted to guide magnetic field lines in a predetermined manner with respect to the at least one sensing element, the magnetic flux guiding surface having three planar surfaces and being substantially v-shaped; and
an integrated circuit package overlying the integrated circuit and magnet body.

32. The magnetic sensor of claim 31, further comprising:
a lead frame abutting the magnet body.

33. The magnetic sensor of claim 32, where the lead frame comprises:
a die area and an engagement surface that are separated from one another by a bendable member.

* * * * *